US007865866B2

(12) United States Patent
Kim et al.

(10) Patent No.: US 7,865,866 B2
(45) Date of Patent: Jan. 4, 2011

(54) METHOD OF INSPECTING MASK USING AERIAL IMAGE INSPECTION APPARATUS (75) Inventors: Hee-Bom Kim, Gyeonggi-do (KR); Min-Kyu Ji, Gyeonggi-do (KR); Sun-Young Choi, Gyeonggi-do (KR); Hyun-Joo Baik, Seoul (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 398 days.

(21) Appl. No.: 12/122,399

(22) Filed: May 16, 2008

(65) Prior Publication Data
US 2008/0288912 A1 Nov. 20, 2008

(30) Foreign Application Priority Data
May 16, 2007 (KR) .................. 10-2007-0047830

(51) Int. Cl.
*G06F 17/50* (2006.01)
(52) U.S. Cl. .................... 716/50; 716/51; 716/53; 716/54; 716/55
(58) Field of Classification Search .................... 716/19, 716/21, 50, 51, 53, 54, 55
See application file for complete search history.

(56) References Cited
U.S. PATENT DOCUMENTS
7,512,927 B2 * 3/2009 Gallatin et al. ............... 716/19

7,703,069 B1 * 4/2010 Liu et al. .................. 716/19

FOREIGN PATENT DOCUMENTS
| JP | 2005-026360 | 1/2005 |
| KR | 2002-0079975 | 10/2002 |
| KR | 2006-0099708 | 9/2006 |
| KR | 2006-0131860 | 12/2006 |

OTHER PUBLICATIONS
English language abstract of Japanese Publication No. 2005-026360.
English language abstract of Korean Publication No. 2006-0099708.
English language abstract of Korean Publication No. 2006-0131860.

* cited by examiner

*Primary Examiner*—Sun J Lin
(74) *Attorney, Agent, or Firm*—Muir Patent Consulting, PLLC (57) ABSTRACT A method of precisely inspecting the entire surface of a mask at a high speed in consideration of optical effects of the mask. The method includes designing a target mask layout for a pattern to be formed on a wafer, and extracting an effective mask layout using an inspection image measured from the target mask layout using an aerial image inspection apparatus as a mask inspection apparatus. The effective mask layout is input to a wafer simulation tool for calculating a wafer image to be formed on the wafer. Optical effects of the mask are detected by comparing the target mask layout with the effective mask layout.

20 Claims, 7 Drawing Sheets

EPE:
EDGE PLACEMENT
ERROR

FIG. 5B (CONVENTIONAL ART)

S/B: SCATTERING BAR

FIG. 5C

METHOD OF INSPECTING MASK USING AERIAL IMAGE INSPECTION APPARATUS

This application claims the benefit of Korean Patent Application No. 10-2007-0047830, filed on May 16, 2007, in the Korean Intellectual Property Office, the disclosure of which is incorporated herein in its entirety by reference.

BACKGROUND OF THE INVENTION

1. Field of the Invention

The present invention relates to a process of manufacturing a semiconductor device, and more particularly, to a method of inspecting a circular mask used to form a fine pattern by exposure in a process of manufacturing a semiconductor device.

2. Description of the Related Art

As the precision of exposure processes increases in the manufacture of semiconductor devices, small mask errors can cause serious wafer defects. Therefore, several thousand or more points of a mask are required to be inspected to achieve a sufficient level of reliability in patterns formed in the mask.

However, since the processing time of current mask inspection equipment, such as a scanning electron microscope (SEM), is slow, only several tens of points of a mask can be inspected. Moreover, optical differences of a mask (e.g., material variations, height variations, or pattern slopes of the mask) that affect formation of a pattern in a wafer cannot be measured using the SEM. In addition, although the entire surface of a mask can be inspected using conventional optical inspection equipment, the optical effects of the mask cannot be precisely measured using the conventional optical inspection equipment since the conventional optical inspection equipment have a low resolution and use a light source having a wavelength different from the wavelength used in an exposure process.

Figure 1:
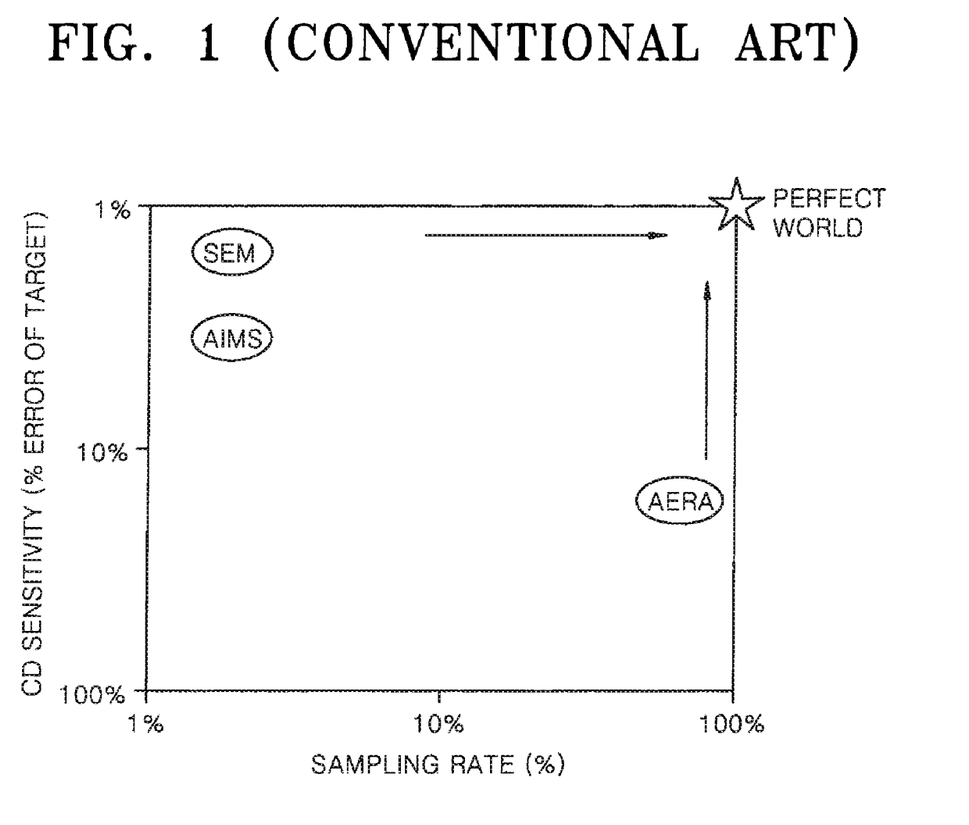
FIG. 1 is a graph illustrating relationships between critical dimension (CD) sensitivity and sampling rate in conventional mask inspection equipment.

FIG. 1 is a graph illustrating relationships between critical dimension (CD) sensitivity and sampling rate in conventional mask inspection equipment. In FIG. 1, the x-axis represents a sampling rate (a ratio of inspected area to the whole area), and the y-axis represents sensitivity for a CD error of a mask. When the sensitivity decreases, CD errors can be more accurately detected.

Referring to FIG. 1, a SEM can precisely detect CD errors only for a very small area of a mask. Similarly, an aerial image measurement system (AIMS) can accurately detect CD errors of a mask only for a small area of a mask; however, an AIMS is less accurate than a SEM. Since a SEM or an AIMS can inspect only a small area of a mask, not all CD errors of the mask can be detected using a SEM or AIMS. Furthermore, the inspection speed of a SEM or AIMS is very slow. In addition, the optical effects of a mask cannot be measured using a SEM as described above.

Meanwhile, although an aerial image inspection apparatus (AERA) is similar to an AIMS, the AERA can inspect the entire surface of a mask at a high speed using a single pulse. However, as illustrated in FIG. 1, since the CD sensitivity of the AERA is not good (i.e., having a higher sensitivity), a mask pattern cannot be precisely measured using the AERA.

Referring to FIG. 1, a star marks a point where the sampling rate is 100% and the CD sensitivity is 0%, which are ideal parameters for a mask inspection method or apparatus.

SUMMARY OF THE INVENTION

Example embodiments of the present invention provide a method of accurately inspecting the entire surface of a mask at a high speed in consideration of optical effects of the mask.

In the method, an effective mask layout may be extracted using a modified optical proximity correction (OPC) algorithm for a mask prepared according to a target mask layout, and mask errors may be detected by comparing the target mask layout and the effective mask layout. Furthermore, a wafer image to be formed on a wafer can be calculated by inputting the effective mask layout to an OPC algorithm, and information about critical dimension (CD) variations and a weak pattern of the wafer caused by errors of the mask may be obtained by comparing the wafer image with a pattern designed for the wafer.

According to example embodiments and methods of the present invention, the entire surface of a mask can be rapidly inspected using an aerial image inspection apparatus, and mask errors can be detected using the extracted effective mask layout. Therefore, information about CD variations and a weak pattern of the wafer caused by the mask errors can be obtained and optical effects of the mask that affect the formation of a pattern in the wafer can be predicted.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, the present invention will be described in detail by explaining preferred embodiments of the invention with reference to the attached drawings. The terms used herein should be considered in descriptive sense only and not for purpose of limitation.

Figure 2:
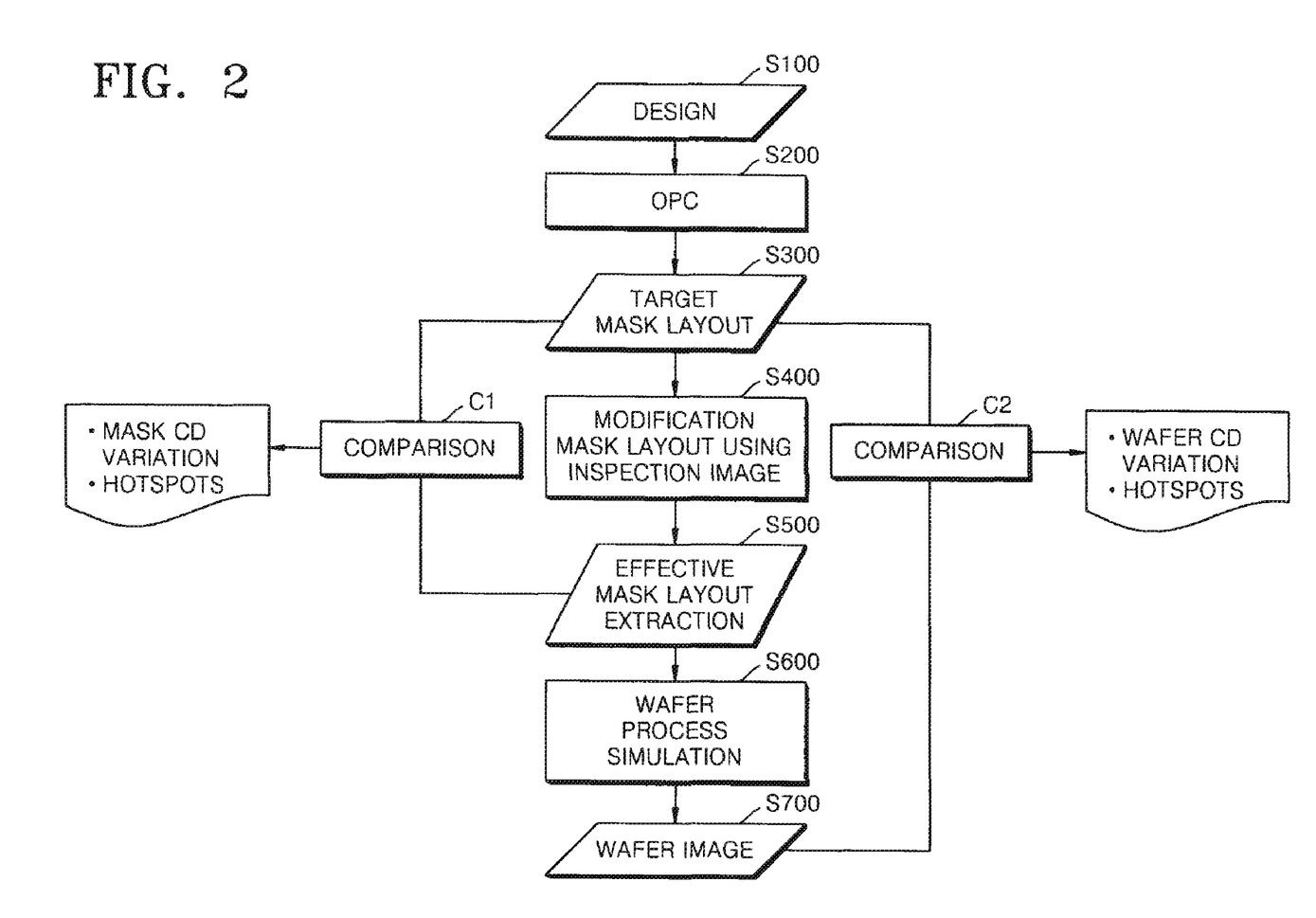
FIG. 2 is a flowchart illustrating a method of inspecting a mask using an aerial image inspection apparatus, according to an embodiment of the present invention.

FIG. 2 is a flowchart illustrating a method of inspecting a mask using an aerial image inspection apparatus, according to an embodiment of the present invention.

Referring to FIG. 2, in operation S100, a pattern to be formed on a wafer is designed. Here, the term "wafer" means a wafer on which a photoresist (PR) layer is formed, and thus, the pattern is a pattern to be formed in the PR layer of the wafer.

In operation S200, optical proximity correction (OPC) is performed for designing of a target mask layout according to the designed pattern. In operation S200, variables of an OPC algorithm are appropriately adjusted according to the optical characteristics of the aerial image inspection apparatus.

In operation S300, the target mask layout for the pattern is designed using the OPC algorithm. As described above, a mask may not be fabricated precisely according to the target mask layout because of errors such as mask material variations, pattern height variations, and pattern slopes. Therefore, the target mask layout may not exactly correspond to a fabricated mask. Thus, an effective mask layout exactly corresponding to a fabricated mask should be determined.

In a conventional mask inspection using a SEM or a general optical measuring apparatus, a mask cannot be accurately inspected, and inspection time is increased because of problems related with the speed, precision, and inspection area of the SEM or the optical inspection apparatus. Hence, it is difficult to find an effective mask layout corresponding to a mask. To solve these problems, an aerial image inspection apparatus and a modified OPC algorithm are used in the current embodiment.

Therefore, in operation S400, the target mask layout is modified using the aerial image inspection apparatus and the modified OPC algorithm so as to find an effective mask layout. Operation S400 will be described in more detail in FIG. 4 and the following drawings.

In operation S500, the effective mask layout is determined and extracted. In operation C1, the extracted effective mask layout is compared with the target mask layout to obtain information about mask CD variations and defects including pattern hotspots. For example, information about optical variations caused by impurities, height variations, or slopes of a mask can be detected.

Meanwhile, in the current embodiment, the entire surface of a mask can be inspected at a high speed using the aerial image inspection apparatus. Hence, an effective mask layout can be extracted easily and precisely.

In operation S600, the extracted effective mask layout is input to a wafer simulation tool to calculate a simulation image (hereinafter, referred to as a wafer image) to be formed on a wafer. The wafer simulation tool may use the above-described OPC algorithm or other OPC algorithms capable of calculating a wafer image in consideration of a PR layer formed on a wafer and the vector effect by an incident angle of light.

In operation S700, the wafer image is extracted. In operation C2, the extracted wafer image is compared with the pattern designed for the wafer to find out information about CD variations or pattern hotspots of the wafer. Meanwhile, since the information about the CD variations or pattern hotspots of the wafer is obtained using the effective mask obtained by OPC, the information reflects mask errors caused by, for example, material variations, pattern height variations, and slopes of the mask.

Therefore, using the mask inspection method according to the current embodiment of the present invention, information about the optical effects of an actual mask can be obtained by comparing the target mask layout with the effective mask layout. In addition, since the wafer image is calculated using the effective mask layout, and the wafer image is compared with the pattern designed for the wafer, a wafer image reflecting the optical effects of the mask can be obtained. Hence, possible errors of a wafer pattern process can be detected and addressed prior to an exposure process. Thus, an accurate pattern can be formed on the wafer, and the yield of the exposure process can be significantly improved.

Figure 3:
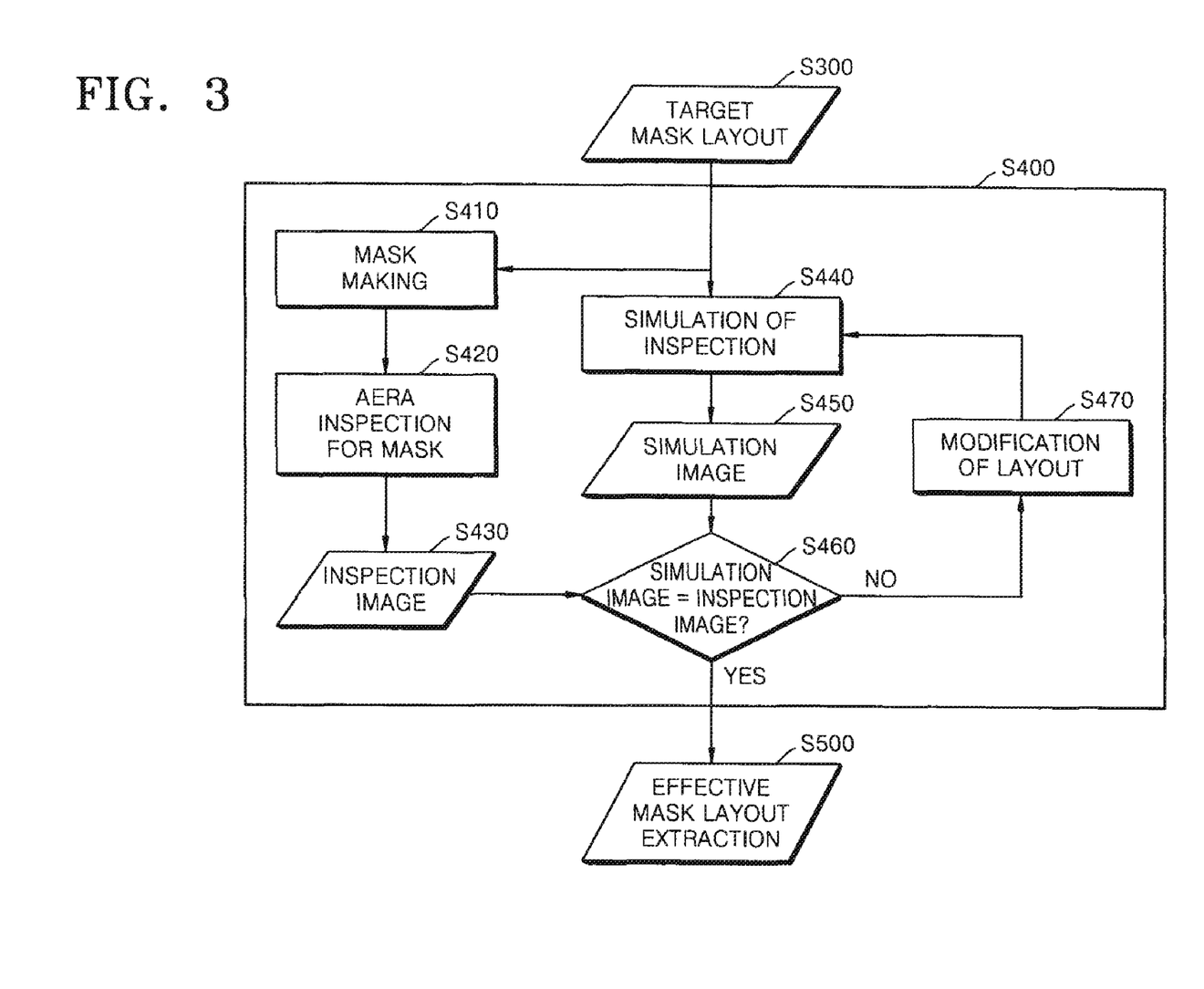
FIG. 3 is a detailed flowchart illustrating an operation of the method illustrated in FIG. 2, specifically, extracting an effective mask layout, according to an embodiment of the present invention.

FIG. 3 is a detailed flowchart illustrating operation S400 of the method illustrated in FIG. 2, according to an embodiment of the present invention. Referring to FIG. 3, in operation S410, a mask is actually fabricated according to the target mask layout designed in operation S300. As explained above, mask errors may be formed in the fabricated mask because of its inevitable characteristics.

In operation 420, the mask is inspected using the aerial image inspection apparatus capable of scanning the entire surface of the mask at a high speed for inspecting a pattern formed in the mask. In operation 430, an inspection image of the mask (hereinafter, referred to as a mask inspection image), which is measured using the aerial image inspection apparatus, is extracted.

Meanwhile, during or after operations 410 through 430, a simulation operation is performed on the target mask layout using an OPC algorithm to calculate an image (hereinafter, referred to as a mask simulation image) to be formed by the target mask layout in operation S440. In operation S450, the calculated mask simulation image is extracted.

In operation S460, the extracted mask simulation image is compared with the mask inspection image extracted using the aerial image inspection apparatus. If the mask simulation image and the mask inspection image are substantially different, the target mask layout is modified in operation S470. Then, operations 440, 450, and 460 are repeated. This process is repeated until the mask simulation image and the mask inspection image are substantially the same. The mask simulation image and the mask inspection image may be considered to be substantially the same if they are within a threshold amount according to known requirements. The mask simulation image calculated for the target mask layout in operation 440 may be changed as the target mask layout is modified in operation 470.

If the mask inspection image and the mask simulation image are substantially the same, the mask simulation image is determined as the effective mask layout, and the effective mask layout is extracted in operation S500.

Ideally, the mask is precisely fabricated according to the target mask layout such that the mask inspection image measured using the aerial image inspection apparatus corresponds to the mask simulation image; however, such an ideal case is rare. Hence, when the mask simulation image is input to the wafer simulation tool to calculate a wafer image, the calculated wafer image may be different from an actual image formed in a wafer using the mask. This difference may cause errors in an exposure process of the wafer, and thus, a desirable pattern cannot be formed in the wafer.

However, in the current embodiment, the effective mask layout, which reflects optical characteristics of a mask such as material variations, pattern height variations, and slopes of the mask, is input to the wafer simulation tool to calculate a wafer image. Hence, the calculated wafer image can be consistent with an image to be formed in the wafer by the mask.

Meanwhile, if the calculated wafer image is different from the pattern designed for the wafer, an effective mask layout corresponding to the designed pattern is found, and the target mask layout can be modified according to the found effective mask layout. Therefore, when the mask is fabricated according to the modified target mask layout, an image formed on the wafer by the mask can be consistent with the pattern designed for the wafer.

Meanwhile, the OPC algorithm used to modify the target mask layout and calculate the mask simulation image is a modified OPC algorithm different from a general OPC algorithm used to calculate the wafer image. The principle of the modified OPC algorithm will be described in detail in FIG. 5C.

According to the current embodiment, the effective mask layout extracted using the aerial image inspection apparatus and the modified OPC algorithm can exactly represent an actual mask. In addition, since the aerial image inspection equipment can inspect the entire surface of a mask at a high speed, a mask inspection operation can be rapidly performed using the aerial image inspection apparatus. Moreover, since the mask inspection image and the mask simulation image can be precisely compared with each other for each pattern segment of a mask, the mask can be precisely inspected (i.e., the mask can be inspected at an improved CD sensitivity level).

FIGS. 4A through 4E are schematic diagrams illustrating the operation of extracting the effective mask layout of FIG. 3 in comparison with an OPC process of a wafer, according to an embodiment of the present invention. In upper sides 400W, 450W, 470W, and 500W of FIGS. 4A, 4B, 4C, and 4E, an OPC process of a wafer is illustrated. In lower sides 400M, 460M, 470M, and 500M of FIGS. 4A, 4B, 4C, and 4E, an OPC process for a mask layout is illustrated.

Figure 4A:
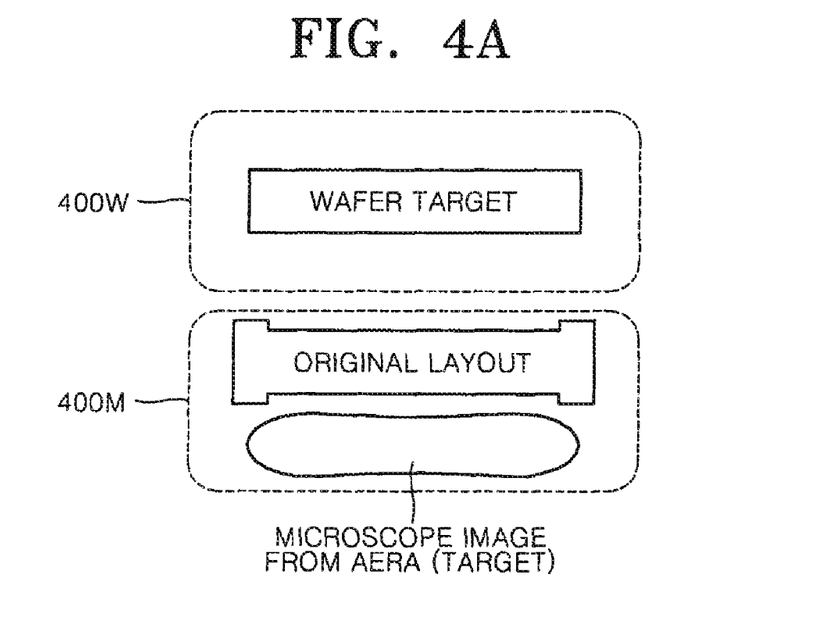
FIGS. 4A through 4E are schematic diagrams for explaining the operation of extracting the effective mask layout of FIG. 3 in comparison with an OPC process of a wafer, according to an embodiment of the present invention.

Referring to FIG. 4A, in the upper side 400W, a wafer target having a rectangular shape is shown. The wafer target is a desired pattern to be formed in the wafer. In the lower side 400M, a target mask layout (hereinafter, also referred to as an original layout or original target mask layout) having an H-shape is shown together with an inspection image (having an oval shape) measured from the target mask layout using the aerial image inspection apparatus.

Figure 4B:
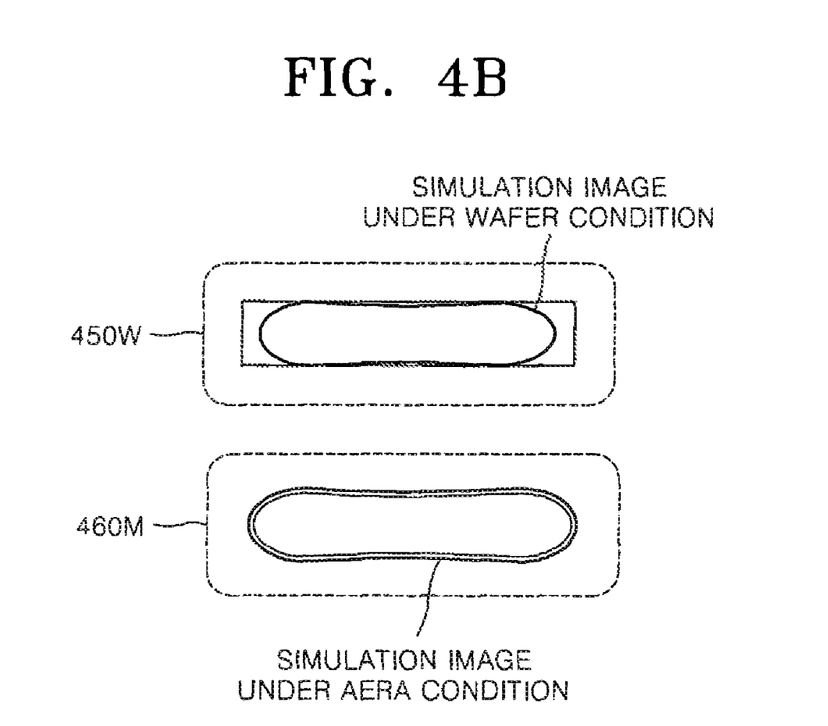

Referring to FIG. 4B, in the upper side 450W, an oval simulation image calculated in consideration of wafer conditions such as a PR layer formed on the wafer or the vector effect of light is shown together with the rectangular wafer target shown in FIG. 4A. In the lower side 460M, the oval inspection image of 4A is shown together with an oval simulation image (larger than the inspection image) that is calculated in consideration of optical effects of the aerial image inspection apparatus.

As illustrated in FIG. 4B, the simulation images of the sides 450W and 460M are different from the wafer target. Hence, in order to compensate for the difference, a modified wafer target or a modified target mask layout should be used as an input for simulation.

Figure 4C:
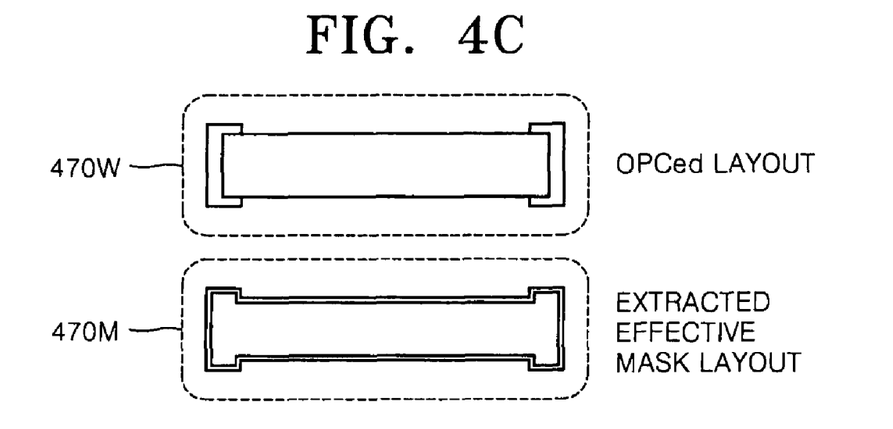

FIG. 4C illustrates examples of a modified wafer target and a modified target mask layout. Referring to the upper side 470W of FIG. 4C, both ends of the modified wafer target are enlarged as compared with the wafer target to compensate for the difference between the wafer target and the simulation image shown in the upper side 450W in FIG. 4B. Meanwhile, since the simulation image is greater than the inspection image as illustrated in the lower side 460M of FIG. 4B, the size of the target mask layout is reduced as shown in the lower side 470M.

Figure 4D:
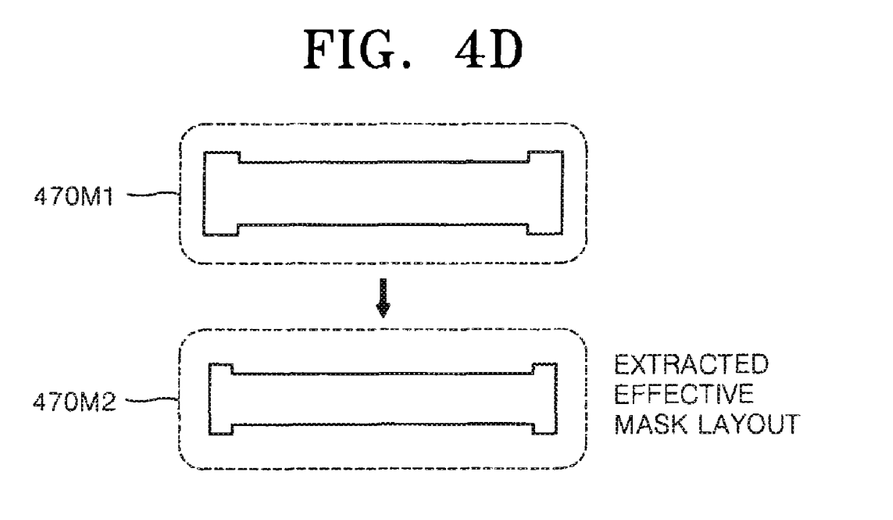

FIG. 4D is a detailed view for explaining the size-reduction of the target mask layout of the lower side 470M of FIG. 4C. In an upper side 470M1, the original target mask layout is shown, and in a lower side 470M2, the modified target mask layout is shown. The difference between the inspection image and the simulation image shown in the lower side 460M in FIG. 4B can be removed by reducing the size of the original target mask layout as shown in FIG. 4D.

Figure 4E:
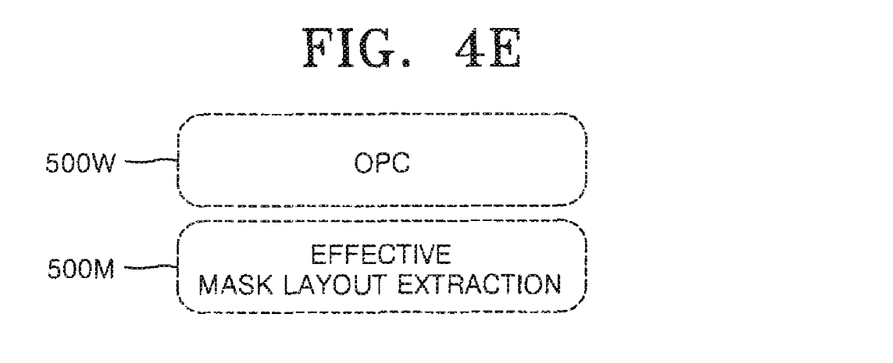

Referring to FIG. 4E, the upper and lower sides 500W and 500M illustrate that a desirable wafer target and a desirable effective mask layout are extracted when the desirable wafer target and desirable effective mask layout are determined in FIG. 4C. That is, after the OPC algorithm is performed, the desirable wafer target and the effective mask layout are extracted.

After the wafer target and the target mask layout are modified as shown in FIGS. 4C and 4D, corresponding data is extracted. In other words, the wafer target is modified by OPC, and an effective mask layout is extracted by modifying the target mask layout.

Figure 5A:
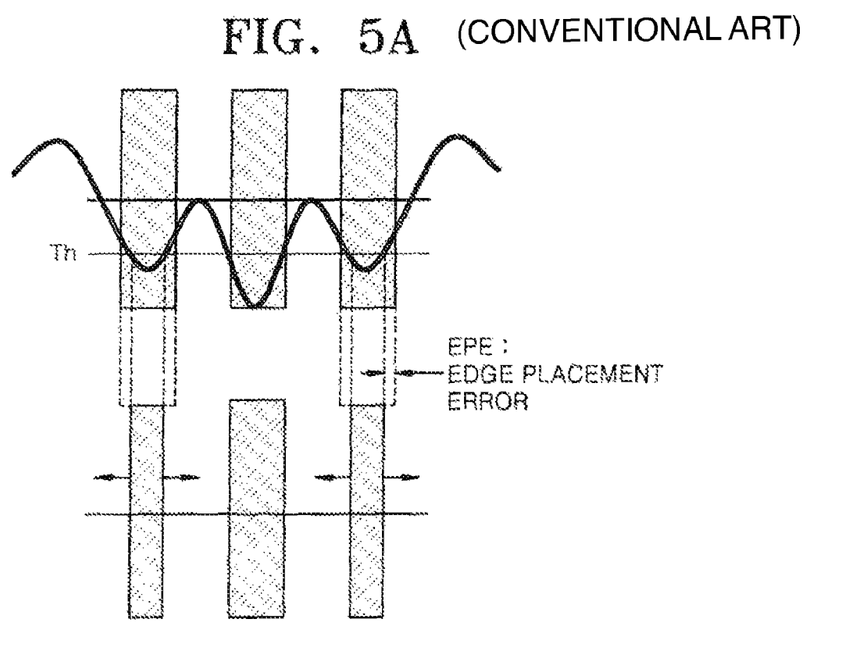
FIGS. 5A and 5B are conceptual diagrams for explaining problems occurring when an effective mask layout is extracted using a conventional OPC algorithm.
Figure 5B:
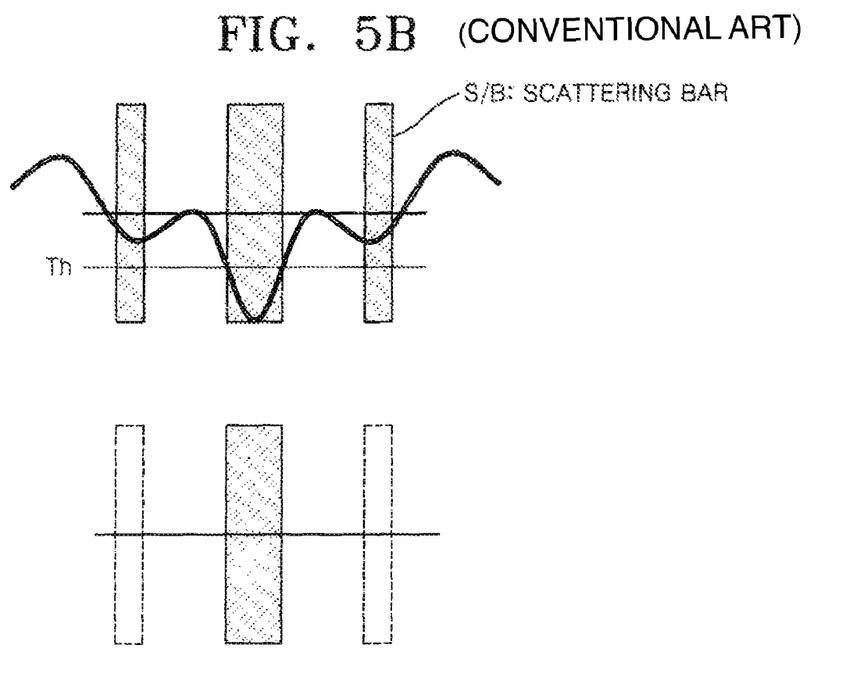

FIGS. 5A and 5B are conceptual diagrams for explaining problems occurring when an effective mask layout is extracted using a conventional OPC algorithm.

FIG. 5A is a conceptual diagram for explaining a conventional OPC algorithm. In the upper side of FIG. 5A, the intensity of light transmitted through an actual mask pattern is shown. In the lower side, a pattern image formed based on a threshold intensity is shown.

Referring to FIG. 5A, the intensity of light transmitted through the mask pattern is varied from a middle portion of the mask pattern to both sides of the mask pattern. Therefore, both sides of the pattern image are different from both sides of the actual mask pattern because of an edge placement error (EPE). For example, when an image for the mask pattern is calculated based on the threshold intensity, both sides of the image may be narrower than both sides of the actual mask pattern. In order to compensate for the difference, the widths of both sides of the mask pattern can be increased. In this case, a desirable pattern image can be obtained. However, there are some problems in applying the conventional OPC algorithm to a mask layout.

FIG. 5B is a conceptual diagram illustrating the application of a conventional OPC algorithm to a mask layout. Referring to FIG. 5B, scattering bars S/B are generally formed in a mask. A small amount of light is transmitted through the scattering bars S/B such that increased intensity of light is offset, thereby to restrain side-lobe levels.

However, it is difficult or impossible to modify a mask layout using a conventional OPC algorithm for a mask having such scattering bars S/B. Specifically, since the intensity of light is relatively high at the scattering bars S/B, an image for the scattering bars S/B cannot be obtained using the conventional OPC algorithm in which an image is calculated based on a threshold intensity. Thus, the mask having the scattering bars S/B cannot be compensated for. For this reason, a modified OPC algorithm is required to modify a mask layout and compensate for a mask.

Figure 5C:
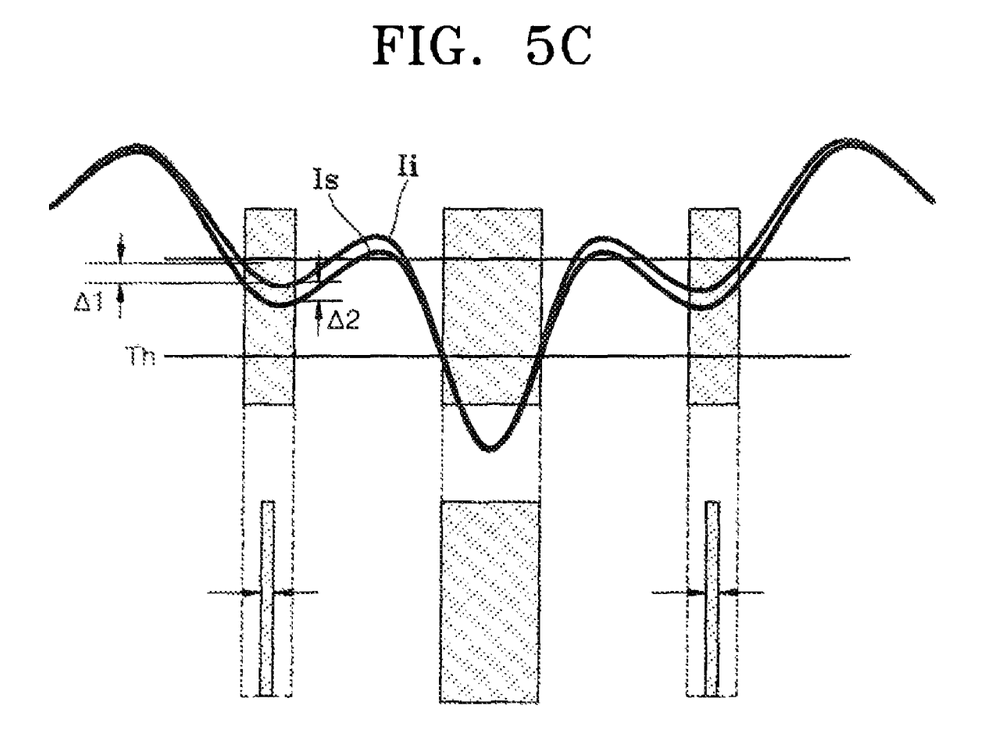
FIG. 5C is a conceptual diagram for explaining how the effective mask layout is extracted in the flowchart of FIG. 3 using a modified OPC algorithm, according to an embodiment of the present invention.

FIG. 5C is a conceptual diagram for explaining how the effective mask layout is extracted in the flowchart of FIG. 3 using a modified OPC algorithm, according to an embodiment of the present invention.

Referring to FIG. 5C, according to the current embodiment using the modified OPC algorithm, an inspection image intensity graph Ii measured using an aerial image inspection apparatus is used together with a simulation image intensity graph Is obtained by calculation in order to compensate for a mask having scattering bars S/B.

In detail, scattering bars S/B of a mask layout are compensated for through a biasing operation by using differences $\Delta 1$ and $\Delta 2$ of the two graphs Ii and Is at a scattering bar S/B (called edge threshold intensity differences, ETD). For example, when the inspection image intensity graph Ii is greater than the simulation image intensity graph Is at a scattering bar S/B, the width of the scattering bar S/B is decreased in the mask layout. When the inspection image intensity is less than the simulation image intensity, the width of the scattering bar S/B is increased. In this way, an effective mask layout can be obtained in consideration of the optical effects of an actual mask.

As described above, according to the method of inspecting a mask using an aerial image inspection apparatus, an effective mask layout can be extracted using the aerial image inspection apparatus and a modified OPC algorithm, and errors caused by the mask can be detected by comparing the extracted effective mask layout with a target mask layout.

Furthermore, information about a weak pattern and CD variations of a wafer caused by the mask can be obtained by calculating a wafer image using the effective mask layout as an input to the OPC algorithm and comparing the wafer image with a pattern designed to be formed in the wafer.

Moreover, the aerial image inspection apparatus can scan the entire surface of the mask at a high speed for inspecting a pattern formed in the mask. Hence, problems with conventional inspection equipment can be overcome. That is, information about pattern defects or CD variations of a wafer caused by the optical effects of the mask can be detected.

Therefore, using the method of inspecting a mask using an aerial image inspection apparatus according to the present invention, possible errors of a wafer patterning process can be detected and prevented using the information about the effects of the mask prior to an exposure process. Thus, the yield of the exposure process can be significantly improved. In addition, a desired pattern can be precisely formed on a wafer.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of inspecting a mask using an aerial image inspection apparatus, the method comprising:
    designing a target mask layout for a pattern to be formed on a wafer;
    extracting an effective mask layout by comparing an inspection image measured from the target mask layout using the aerial image inspection apparatus with a simulation image; and
    inputting the effective mask layout to a wafer simulation tool for calculating a wafer image to be formed on the wafer,
    wherein optical effects of the mask are detected by comparing the target mask layout with the effective mask layout.

2. The method of claim 1, wherein the extracting an effective mask layout comprises:
    fabricating the mask according to the target mask layout for measuring the inspection image of the target mask layout;
    calculating the simulation image of the target mask layout;
    comparing the simulation image with the inspection image; and
    when the simulation image is substantially the same as the inspection image, selecting the target mask layout as the effective mask layout.

3. The method of claim 2,
    wherein when the simulation image is not substantially the same as the inspection image, extracting of the effective mask layout comprises:
    (a) modifying the target mask layout;
    (b) calculating a simulation image of the modified target mask layout;
    (c) comparing the simulation image of the modified target mask layout with the inspection image; and
    repeating (a) through (c) until the simulation image is substantially the same as the inspection image, and selecting the modified target mask layout as the effective mask layout.

4. The method of claim 1, wherein the designing a target mask layout comprises:
    designing the pattern;
    adjusting variables of an optical proximity correction (OPC) algorithm using optical characteristics of the aerial image inspection apparatus; and
    designing the target mask layout for the pattern using the OPC algorithm.

5. The method of claim 1, wherein the extracting an effective mask layout is performed using a modified optical proximity correction (OPC) algorithm.

6. The method of claim 5, wherein the modified OPC algorithm comprises a biasing operation for a scattering bar of the effective mask layout.

7. The method of claim 6, wherein the biasing operation for the scattering bar is performed by compensating for an edge threshold intensity difference (ETD) between the inspection image and the simulation image at an edge portion of the scattering bar.

8. The method of claim 1, wherein the wafer simulation tool is an optical proximity correction (OPC) algorithm for calculating the wafer image in consideration of wafer conditions, the wafer conditions including a photoresist (PR) layer formed on the wafer and vector effects of light.

9. The method of claim 1, wherein a mask error caused by the mask is detected by comparing the target mask layout with the effective mask layout.

10. The method of claim 9, wherein information about critical dimension (CD) variations and a weak pattern of the wafer caused by the mask error is obtained by comparing the pattern with the wafer image.

11. The method of claim 9, wherein the mask error is at least one of a defect of the 30 mask, a critical dimension (CD) uniformity error of the mask, and a CD error of a pattern of the mask.

12. A method of inspecting a mask using an aerial image inspection apparatus, the method comprising:
    designing a pattern to be formed on a wafer;
    adjusting variables of an optical proximity correction (OPC) algorithm using optical characteristics of the aerial image inspection apparatus, the aerial image inspection apparatus being used as a mask inspection apparatus;
    designing a target mask layout for the pattern using the OPC algorithm;
    extracting an effective mask layout by comparing an inspection image measured from the target mask layout using the aerial image inspection apparatus with a simulation image; and
    inputting the effective mask layout to a wafer simulation tool for calculating a wafer image to be formed on the wafer,
    wherein optical effects of the mask are detected by comparing the target mask layout with the effective mask layout.

13. The method of claim 12, wherein the extracting an effective mask layout comprises:
    fabricating the mask according to the target mask layout for measuring the inspection image of the target mask layout;
    calculating the simulation image of the target mask layout;
    comparing the simulation image with the inspection image; and
    when the simulation image is substantially the same as the inspection image, selecting the target mask layout as the effective mask layout.

14. The method of claim 13,
wherein when the simulation image is not substantially the same as the inspection image, extracting of the effective mask layout comprises:
(a) modifying the target mask layout;
(b) calculating a simulation image of the modified target mask layout;
(c) comparing the simulation image of the modified target mask layout with the inspection image;
repeating (a) through (c) until the simulation image is substantially the same as the inspection image, and selecting the modified target mask layout as the effective mask layout.

15. The method of claim 12, wherein the extracting an effective mask layout is performed using a modified OPC algorithm.

16. The method of claim 15, wherein the modified OPC algorithm comprises a biasing operation for a scattering bar of the effective mask layout.

17. The method of claim 16, wherein the biasing operation for the scattering bar is performed by compensating for an edge threshold intensity difference (ETD) between the inspection image and the simulation image at an edge portion of the scattering bar.

18. The method of claim 12, wherein:
the wafer simulation tool is an OPC algorithm for calculating the wafer image in consideration of wafer conditions, the wafer conditions including a photoresist (PR) layer formed on the wafer and vector effects of light;
a mask error caused by the mask is detected by comparing the target mask layout with the effective mask layout; and
information about critical dimension (CD) variations and a weak pattern of the wafer caused by the mask error is obtained by comparing the pattern with the wafer image.

19. The method of claim 18, wherein the mask error is at least one of a defect of the mask, a CD uniformity error of the mask, and a CD error of a pattern of the mask.

20. A method of inspecting a mask using an aerial image inspection apparatus, the method comprising:
designing a pattern to be formed on a wafer;
adjusting variables of an optical proximity correction (OPC) algorithm using optical characteristics of the aerial image inspection apparatus, the aerial image inspection apparatus being used as a mask inspection apparatus;
designing a target mask layout for the pattern using the OPC algorithm;
extracting an effective mask layout by comparing an inspection image measured from the target mask layout using the aerial image inspection apparatus with a simulation image;
inputting the effective mask layout to a wafer simulation tool for calculating a wafer image to be formed on the wafer; and
detecting optical effects of the mask by comparing the target mask layout with the effective mask layout,
wherein the extracting an effective mask layout is performed using a modified OPC algorithm comprising a biasing operation for a scattering bar of the effective mask layout, the biasing operation for the scattering bar being performed by compensating for an edge threshold intensity difference (ETD) between the inspection image and the simulation image at an edge portion of the scattering bar, wherein when an inspection image intensity is greater than a simulation image intensity, a width of the scattering bar is decreased in the effective mask layout, and wherein when the inspection image intensity is less than the simulation image intensity, the width of the scattering bar is increased in the effective mask layout.

* * * * *